(12) United States Patent
Hwang

(10) Patent No.: US 7,883,957 B2
(45) Date of Patent: Feb. 8, 2011

(54) IMAGE SENSOR AND METHOD FOR MANUFACTURING THE SAME

(75) Inventor: Joon Hwang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 37 days.

(21) Appl. No.: 12/204,863

(22) Filed: Sep. 5, 2008

(65) Prior Publication Data

US 2009/0065887 A1    Mar. 12, 2009

(30) Foreign Application Priority Data

Sep. 7, 2007    (KR) .................. 10-2007-0090978

(51) Int. Cl.
*H01L 21/8234* (2006.01)
(52) U.S. Cl. .............. 438/237; 257/E21.352
(58) Field of Classification Search .......... 438/237; 257/E21.352
See application file for complete search history.

(56) References Cited

U.S. PATENT DOCUMENTS

| | | | |
|---|---|---|---|
| 6,927,432 B2 * | 8/2005 | Holm et al. ............ | 257/290 |
| 7,064,406 B2 * | 6/2006 | Mouli ................. | 257/446 |
| 7,154,136 B2 * | 12/2006 | Cole et al. ............ | 257/292 |
| 2005/0156213 A1 | 7/2005 | Han et al. | |
| 2007/0018266 A1 | 1/2007 | Dupont et al. | |
| 2007/0069321 A1 | 3/2007 | Hwang | |

FOREIGN PATENT DOCUMENTS

| | | |
|---|---|---|
| KR | 10-2005-0117674 A | 12/2005 |
| KR | 10-2006-0077082 A | 7/2006 |

* cited by examiner

*Primary Examiner*—Chandra Chaudhari
(74) *Attorney, Agent, or Firm*—Saliwanchik, Lloyd & Saliwanchik

(57) ABSTRACT

Provided is an image sensor and a method for manufacturing the same. In the image sensor, a first substrate has a lower metal line and circuitry thereon. A crystalline semiconductor layer contacts the lower metal line and is bonded to the first substrate. A photodiode is provided in the crystalline semiconductor layer and electrically connected with the lower metal line. A pixel isolation layer is formed in regions of the photodiode.

8 Claims, 9 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0090978, filed Sep. 7, 2007, which is hereby incorporated by reference in its entirety.

BACKGROUND

In general, an image sensor is a semiconductor device that converts an optical image to an electric signal. Image sensors are generally classified as a charge coupled device (CCD) image sensor or a complementary metal oxide silicon (CMOS) image sensor (CIS).

In a related art image sensor, a photodiode is formed in a substrate with transistor circuitry using ion implantation. As the size of a photodiode reduces more and more for the purpose of increasing the number of pixels without an increase in chip size, the area of a light receiving portion reduces, so that an image quality reduces.

Also, since a stack height does not reduce as much as the reduction in the area of the light receiving portion, the number of photons incident to the light receiving portion also reduces due to diffraction of light, called airy disk.

In a horizontal type CMOS image sensor according to the related art, a photodiode and a transistor are horizontally formed adjacent to each other on a substrate. Therefore, an additional region for the photodiode is required, which may decrease a fill factor region and limit the possibility of resolution.

Also, the horizontal type CMOS image sensor according to the related art may cause a crosstalk problem between pixels.

Moreover, in the horizontal type CMOS image sensor according to the related art, it is very difficult to achieve the optimized process of concurrently forming the photodiode and the transistor.

As an alternative to overcome this limitation, an attempt of forming a photodiode using amorphous silicon (Si), or forming a readout circuitry on a Si substrate and forming a photodiode on the readout circuitry using a method such as wafer-to-wafer bonding has been made (referred to as a "three-dimensional (3D) image sensor). The photodiode is connected with the readout circuitry through a metal line.

BRIEF SUMMARY

Embodiments of the present invention provide an image sensor and a method for manufacturing the same that can provide a vertical integration of a transistor circuitry and a photodiode.

Embodiments also provide an image sensor and a method for manufacturing the same that can employ a vertical type photodiode capable of inhibiting crosstalk between photodiode pixels.

Embodiments also provide an image sensor and a method for manufacturing the same that can improve resolution and sensitivity.

Embodiments also provide an image sensor and a method for manufacturing the same that can employ a vertical type photodiode having reduced defects in the vertical type photodiode.

In one embodiments an image sensor can comprise: a first substrate having a lower metal line and a circuitry formed thereon; a crystalline semiconductor layer contacting the lower metal line and bonded to the first substrate; a photodiode provided in the crystalline semiconductor layer and electrically connected with the lower metal line; and a pixel isolation layer in the photodiode.

In an embodiment, a method for manufacturing an image sensor can comprise: preparing a first substrate having a lower metal line and a circuitry thereon; preparing a second substrate having a photodiode thereon; forming a pixel isolation layer in the photodiode of the second substrate; bonding the first substrate to the second substrate such that the photodiode in which the pixel isolation layer is formed electrically contacts the lower metal line; and removing a lower portion of the bonded second substrate to leave the photodiode on the first substrate.

In another embodiment, a method for manufacturing an image sensor can comprise: preparing a first substrate having a lower metal line and a circuitry thereon; preparing a second substrate having a photodiode thereon; bonding the first substrate to the second substrate such that the photodiode contacts the lower metal line; removing a lower portion of the bonded second substrate to expose the photodiode; and forming a pixel isolation layer in the exposed photodiode.

The details of one or more embodiments are set forth in the accompanying drawings and the description below. Other features will be apparent from the description and drawings, and from the claims.

DETAILED DESCRIPTION

Embodiments of an image sensor and a method for manufacturing the same will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
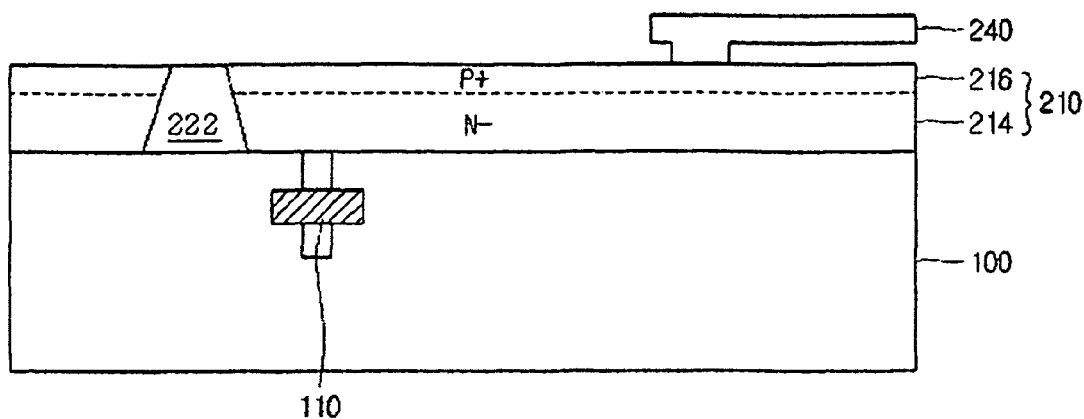
FIG. 1 is a cross-sectional view of an image sensor according to a first embodiment.

FIG. 1 is a cross-sectional view of an image sensor according to a first embodiment.

An image sensor according to the first embodiment can include: a first substrate 100 having a lower metal line 110 and circuitry (not shown) thereon; a crystalline semiconductor layer 210a (see FIG. 3) contacting the lower metal line 110 and bonded to the first substrate 100; a photodiode 210 provided in the crystalline semiconductor layer 210a and electrically connected with the lower metal line 110; and a pixel isolation layer 222 in the photodiode 210 to separate the photodiode 210 according to unit pixel.

The image sensor according to an embodiment can reduce defects in a photodiode by employing a vertical type photodiode in which the photodiode is positioned on the circuitry, and forming the photodiode in the crystalline semiconductor layer.

Also, the image sensor according to an embodiment can inhibit crosstalk between pixels due to an incident light by employing a vertical type photodiode and forming the pixel isolation layer 222 between pixels. In an embodiment, the pixel isolation layer 222 can be a shallow trench isolation (STI) layer, but embodiments are not limited thereto.

Also, while FIG. 1 exemplarily shows that an upper width of the pixel isolation layer 222 is narrower than a lower width of the pixel isolation layer 222, embodiments are not limited thereto.

According to an embodiment, the crystalline semiconductor layer can be a single crystalline semiconductor layer, but embodiments are not limited thereto. For example, the crystalline semiconductor layer can be a polycrystalline semiconductor layer.

Although the circuitry of the first substrate 100 is not shown, in the case of a CIS, the circuitry is not limited to a 4 Tr CIS having four transistors, but may be applied to a 1 Tr CIS, 3 Tr CIS, 5 Tr CIS, 1.5 Tr CIS (transistor-shared CIS), or the like.

Also, the lower metal line 110 formed on the first substrate 100 can include a lower metal (not shown) and a lower plug (not shown). An uppermost portion of the lower metal line 110 may function as a lower electrode of the photodiode.

The photodiode 210 can include a first conductive type conduction layer 214 in the crystalline semiconductor layer 210a, and a second conductive type conduction layer 216 on the first conductive type conduction layer 214 in the crystalline semiconductor layer.

For example, the photodiode 210 can include a lightly doped N-type conduction layer 214 formed in the crystalline semiconductor layer 210a, and a heavily doped P-type conduction layer 216 formed in the crystalline semiconductor layer, but embodiments are not limited thereto. For example, the first conductive type is not limited to N-type, and may be P-type.

Figure 9:
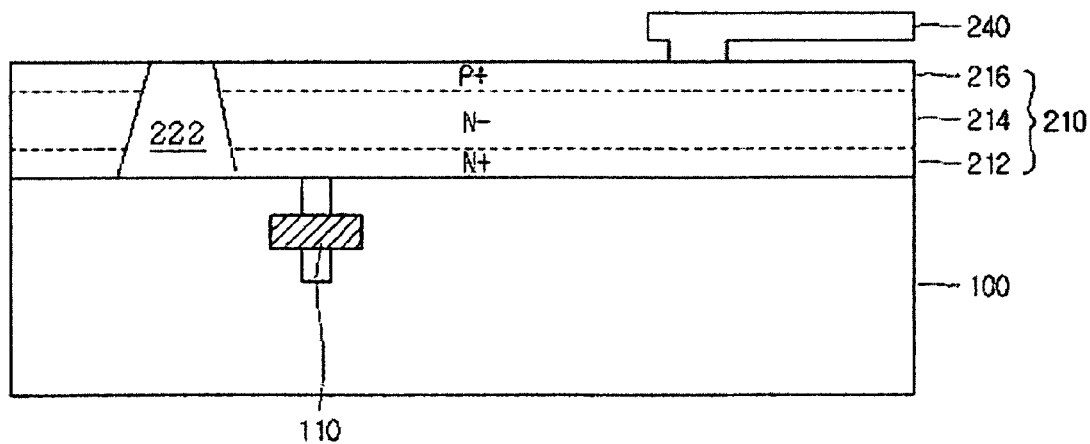
FIG. 9 is a cross-sectional view of an image sensor according to another embodiment of the first embodiment.

Also, in another embodiment as shown in FIG. 9, the photodiode 210 can further include a heavily doped first conductive type conduction layer 212 beneath the first conductive type conduction layer 214 in the crystalline semiconductor layer. The heavily doped first conductive type conduction layer 212 can be formed for an ohmic contact to the first substrate 100.

For example, the photodiode 210 can further include a heavily doped N-type conduction layer 212 formed in the crystalline semiconductor layer.

In a further embodiment, a top metal 240 can be formed on the photodiode 210 and/or a color filter (not shown) can be formed on the photodiode 210.

A method for manufacturing an image sensor according to the first embodiment will now be described with respect to FIGS. 2 to 8.

Figure 2:
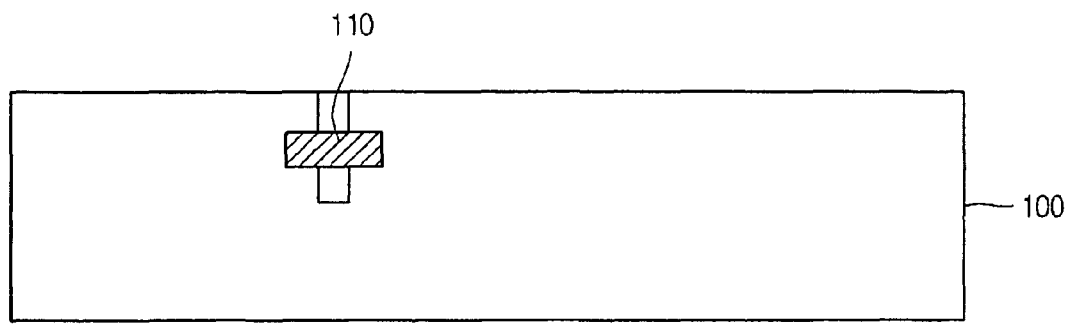
FIGS. 2 to 8 are cross-sectional views illustrating a method for manufacturing an image sensor according to the first embodiment.

As shown in FIG. 2, a first substrate 100 having a lower metal line 110 and a circuitry (not shown) can be prepared. Although the circuitry of the first substrate 100 is not shown, in the case of a CIS, the circuitry is not limited only to a 4 Tr CIS having four transistors as described.

Also, the lower metal line 110 can include a lower metal (not shown) and a lower plug (not shown).

Figure 3:
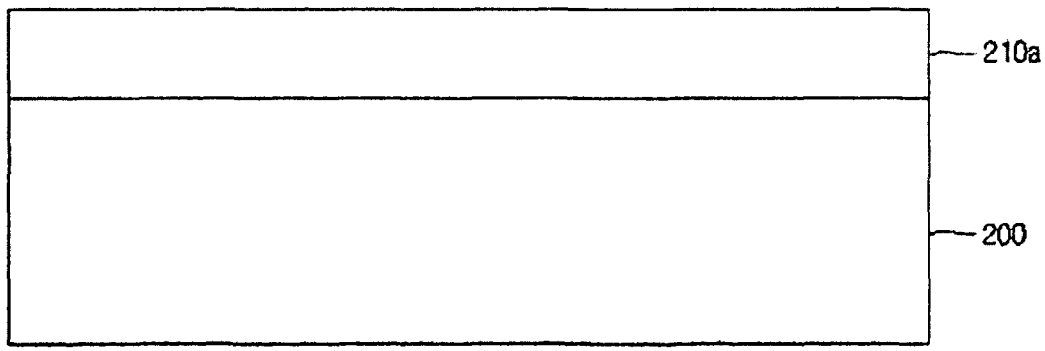

As shown in FIG. 3, a crystalline semiconductor layer 210a can be formed on a second substrate 200. By forming a photodiode in the crystalline semiconductor layer 210a, it is possible to reduce defects in the photodiode. In an embodiment, the second substrate 200 can include an insulating layer interposed between the second substrate 200 and the crystalline semiconductor layer 210a. In one embodiment, the crystalline semiconductor layer 210a can be epitaxially grown on the second substrate 200.

Alternatively, it is also possible to use an upper portion of the second substrate 200 itself as a crystalline semiconductor layer in which a photodiode is formed.

Figure 4:
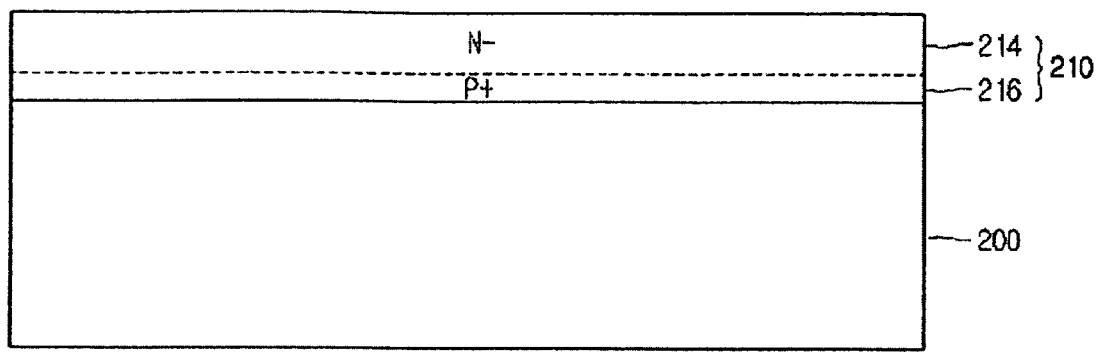

Next, as shown in FIG. 4, ions can be implanted into the crystalline semiconductor layer 210a to form a photodiode 210. For example, a second conductive type conduction layer 216 can be formed at a lower portion of the crystalline semiconductor layer 210a. For example, a heavily doped P-type conduction layer 216 can be formed by performing a blanket ion implantation into the second substrate 200 (including the crystalline semiconductor layer 210a) into a lower portion of the crystalline semiconductor layer 210a without a mask. For example, the second conductive type conduction layer 216 may be formed having a junction depth less than or equal to approximately 0.5 μm. The second conductive type conduction layer 216 can be formed in the crystalline semiconductor layer 210a near a surface of the second substrate 200.

Thereafter, a first conductive type conduction layer 214 can be formed on the second conductive type conduction layer 216. For example, a lightly doped N-type conduction layer 214 can be formed on the second conductive conduction layer 216 by performing a blanket ion implantation into an entire surface of the second substrate 200 without a mask. For example, the lightly doped first conductive type conduction layer 214 can be formed having a junction depth ranged from approximately 1.0 μm to 2.0 μm.

In a further embodiment as shown in FIG. 9 a heavily doped first conductive type conduction layer 212 can be formed on the first conductive type conduction layer 214. For example, a heavily doped N-type conduction layer 212 can be formed on the first conductive type conduction layer 214 by performing a blanket ion implantation into an entire surface of the second substrate 200 without a mask. For example, the heavily doped first conductive type conduction layer 212 can be formed having a junction depth ranging from approximately 0.05 μm to 0.2 μm.

Figure 5:
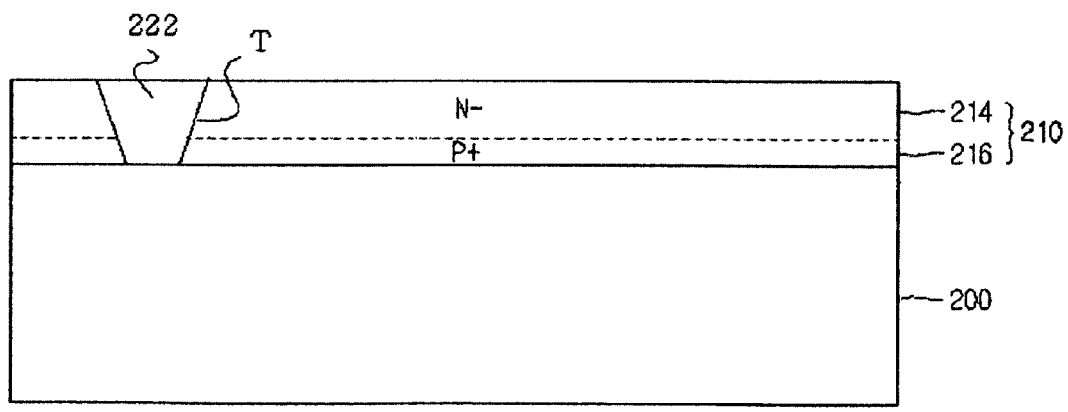

Next, as shown in FIG. 5, a pixel isolation layer that can inhibit crosstalk between pixels is formed in the crystalline semiconductor layer 210a in which the photodiode 210 is formed.

For example, the pixel isolation layer 222 can be formed by forming a trench T in the crystalline semiconductor layer 210a in which the photodiode 210 is formed, and filling the trench T with an insulating layer. For example, the pixel isolation layer 222 can be formed by forming a trench T in the crystalline semiconductor layer 210a, forming a liner oxide layer (not shown) on the trench T, depositing an oxide material layer on the trench T and planarizing the resultant structure.

Figure 6:
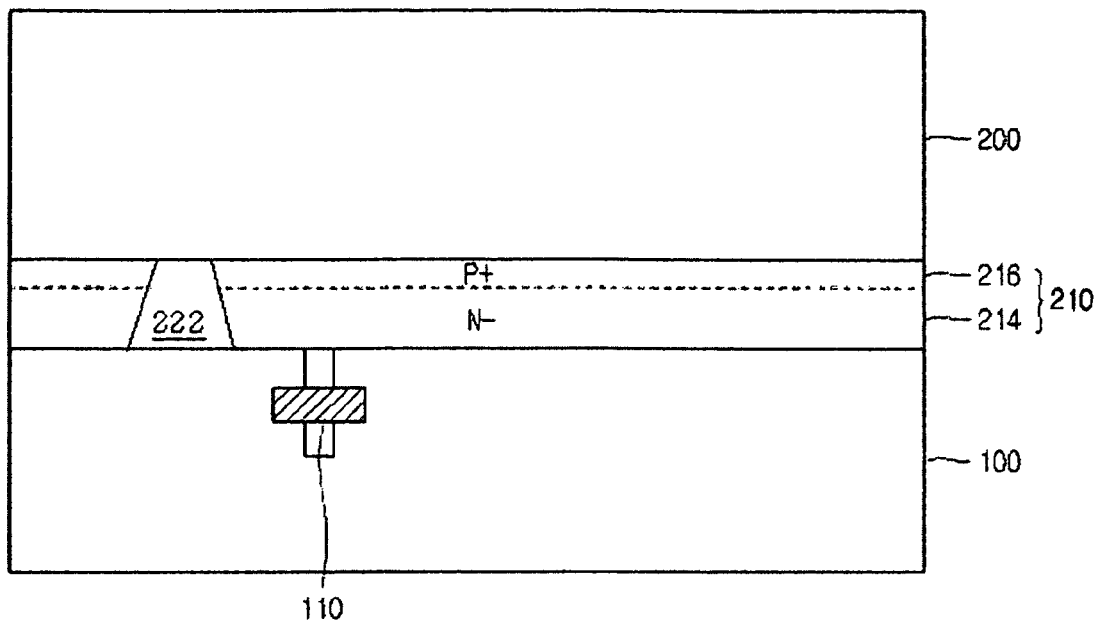

Next, referring to FIG. 6, the second substrate 200 can be bonded to the first substrate 100 such that the photodiode 210 of the second substrate 200 having the pixel isolation layer 222 contacts the lower metal line 110 of the first substrate 100.

For example, in one embodiment, the first substrate 100 and the second substrate 200 can be bonded by contacting the first substrate 100 and the second substrate 200 and then performing a plasma activation. However, embodiments are not limited thereto.

At this time, the bonding may be performed more easily when the insulating layer 221 of the second substrate 200 and the interlayer insulating layer of the first substrate 100 are made of the same material.

Also, when the first substrate 100 and the second substrate 200 are bonded to each other, the pixel isolation layer 222 and the lower metal line 110 are aligned such that the pixel isolation layer 222 does not contact the lower metal line 110.

Figure 7:
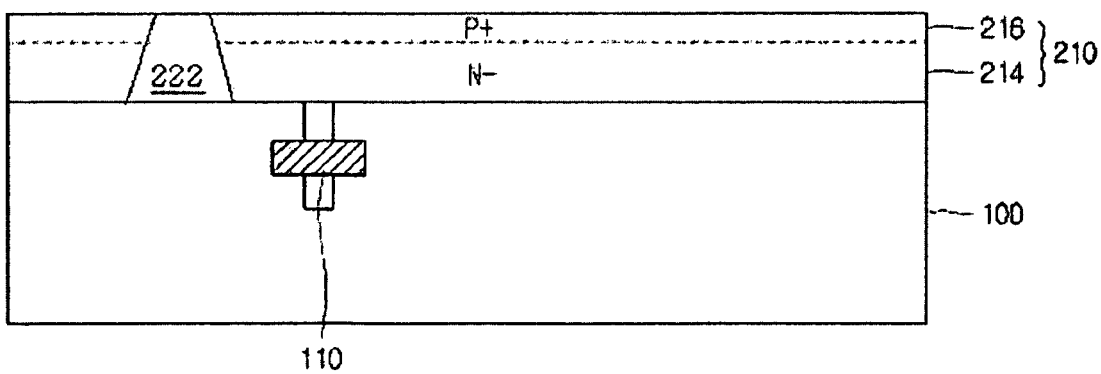

Next, as shown in FIG. 7, a portion of the bonded second substrate 200 is removed to expose and leave the photodiode 210. For example, in the case where the second substrate 200 includes an insulating layer interposed between the second substrate 200 and the crystalline semiconductor layer, the portion of the second substrate 200 can be removed by back grinding, and the insulating layer exposed after the removal of the lower portion of the second substrate 200 can be removed by an etch to leave only the photodiode 210 on the first substrate 100.

Alternatively, in the case where part of the second substrate 200 itself is used as a crystalline semiconductor layer in which a photodiode is being formed, hydrogen ions ($H^+$) can be implanted, before bonding the first substrate 100 to the second substrate 200, into the lower portion of the crystalline semiconductor layer in which a photodiode is formed, and the second substrate 200 can then be thermally annealed after being bonded to the first substrate 100 to transform the hydrogen ion (H+) into hydrogen gas ($H_2$), thereby leaving only the photodiode and removing the second substrate.

Figure 8:
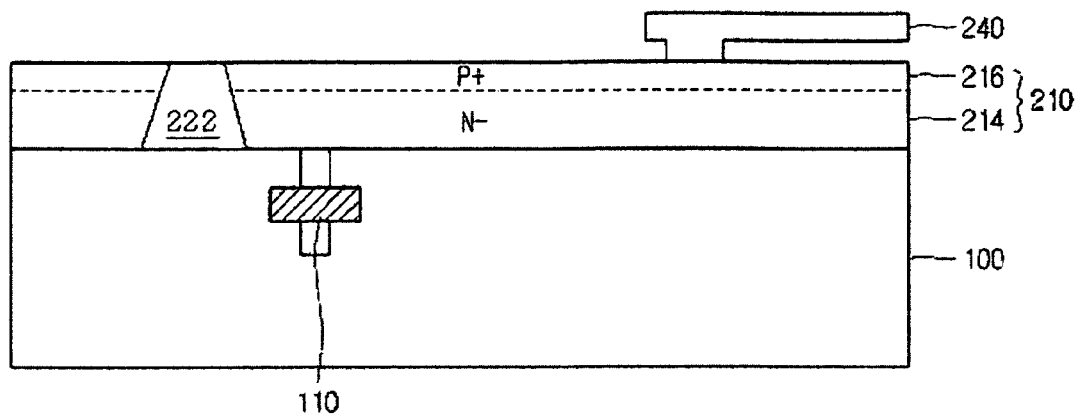

Next, as shown in FIG. 8, a top metal 230 can be formed on the photodiode 210 and then a passivation (not shown) can be performed. Also, a color filter (not shown) can be further formed on the photodiode 210, and a microlens can be further formed on the color filter.

Also, in a further embodiment, a transparent conduction layer (not shown) can be formed between the photodiode 210 and the top metal 240 such that the top metal does not cover each pixel. In such embodiments, the transparent conduction layer performs the function of the top metal. In an embodiment, the transparent conduction layer can be formed of indium-tin-oxide (ITO), but embodiments are not limited thereto. The transparent conduction layer may be formed to overlap at least two pixel regions. In other embodiments, the transparent conduction layer can be omitted.

The image sensor and the method for manufacturing the image sensor according to embodiments can reduce defects in a photodiode by employing a vertical type photodiode in which the photodiode is positioned on the circuitry, and forming the photodiode in a crystalline semiconductor layer.

Also, according to embodiments of the present invention, crosstalk between pixels can be inhibited by employing a vertical type photodiode and forming a pixel isolation layer between the pixels.

Figure 10:
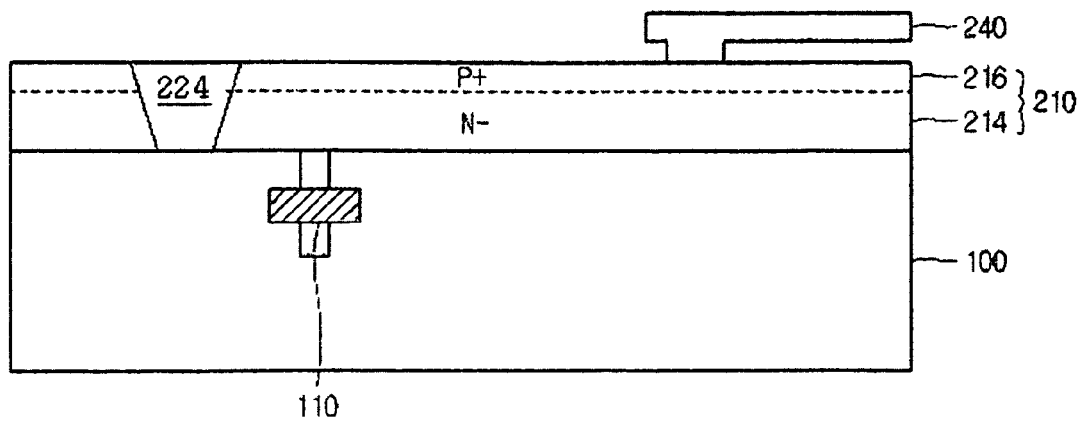
FIG. 10 is a cross-sectional view of an image sensor according to a second embodiment.

FIG. 10 is a cross-sectional view of an image sensor according to a second embodiment, and FIGS. 11 to 15 are cross-sectional views illustrating a method for manufacturing an image sensor according to the second embodiment.

The second embodiment can employ the technical characteristics of the first embodiment.

For example, the image sensor according to the second embodiment can include: a first substrate 100 having a lower metal line 110 and a circuitry (not shown); a crystalline semiconductor layer 210a (see FIG. 3) contacting the lower metal line 110 and bonded to the first substrate 100; a photodiode 210 provided in the crystalline semiconductor layer 210a and electrically connected with the lower metal line 110; and a pixel isolation layer 224 in the photodiode 210 separating the photodiode 210 according to unit pixel.

The subject image sensor can reduce defects in a photodiode by employing a vertical type photodiode in which the photodiode is positioned on the circuitry, and forming the photodiode in the crystalline semiconductor layer.

Also, the subject image sensor can inhibit crosstalk between pixels by employing a vertical type photodiode and forming the pixel isolation layer 224 between the pixels.

Meanwhile, unlike in the first embodiment, in the second embodiment, the pixel isolation layer 224 is formed in the photodiode 210 after the first substrate 100 and the second substrate 200 are bonded. Accordingly, the pixel isolation layer 224 in the second embodiment can be shaped such that its upper portion is wider than its lower portion. However, embodiments are not limited thereto.

Figure 11A:
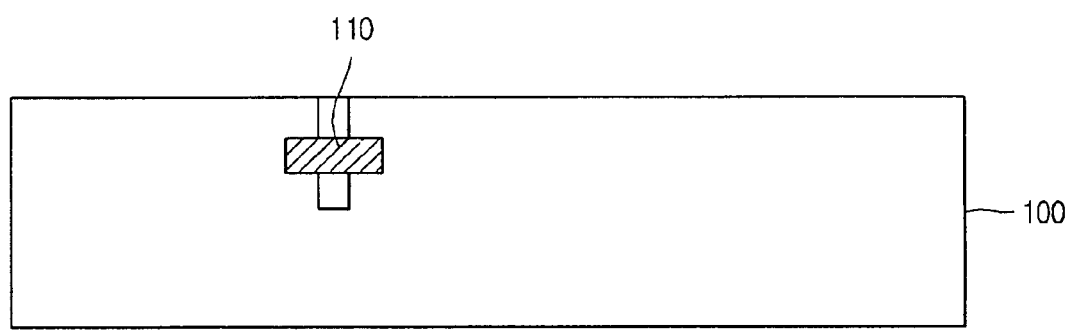
FIGS. 11 to 15 are cross-sectional views illustrating a method for manufacturing an image sensor according to the second embodiment.

In a specific embodiment, as shown in FIG. 11A, the first substrate 100 having a lower metal line 110 and a circuitry (not shown) can be prepared. The lower metal line 110 can include a lower metal (not shown) and a lower plug (not shown).

Figure 11B:
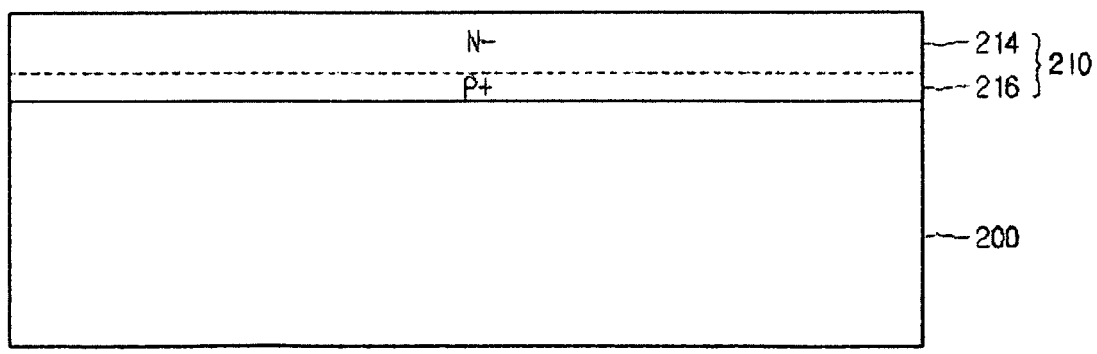

In addition, as shown in FIG. 11B, a crystalline semiconductor layer 210a (see FIG. 3) can be formed on the second substrate 200. The photodiode 210 can be formed in the crystalline semiconductor layer 210a.

In one embodiment, the second substrate 200 can include an insulating layer interposed between the second substrate 200 and the crystalline semiconductor layer 210a.

In another embodiment, it is also possible to use an upper portion of the second substrate 200 itself as a crystalline semiconductor layer in which the photodiode is being formed.

The photodiode 210 can be formed by implanting ions into the crystalline semiconductor layer 210a.

For example, a second conductive type conduction layer 216 can be formed at a lower portion of the crystalline semiconductor layer 210a. Thereafter, a first conductive type conduction layer 214 can be formed on the second conductive type conduction layer 216.

Figure 16:
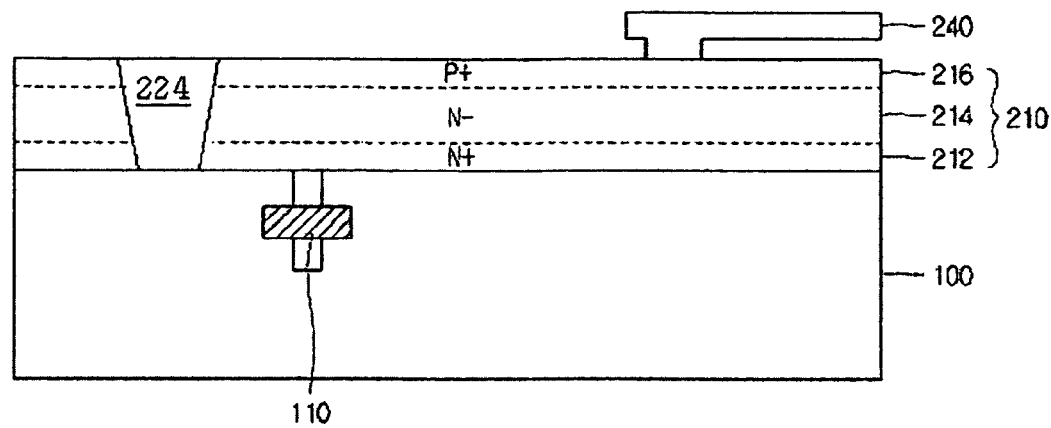
FIG. 16 is a cross-sectional view of an image sensor according to another embodiment of the second embodiment.

In a further embodiment as shown in FIG. 16 a heavily doped first conductive type conduction layer 212 can be formed on the first conductive type conduction layer 214.

Figure 12:
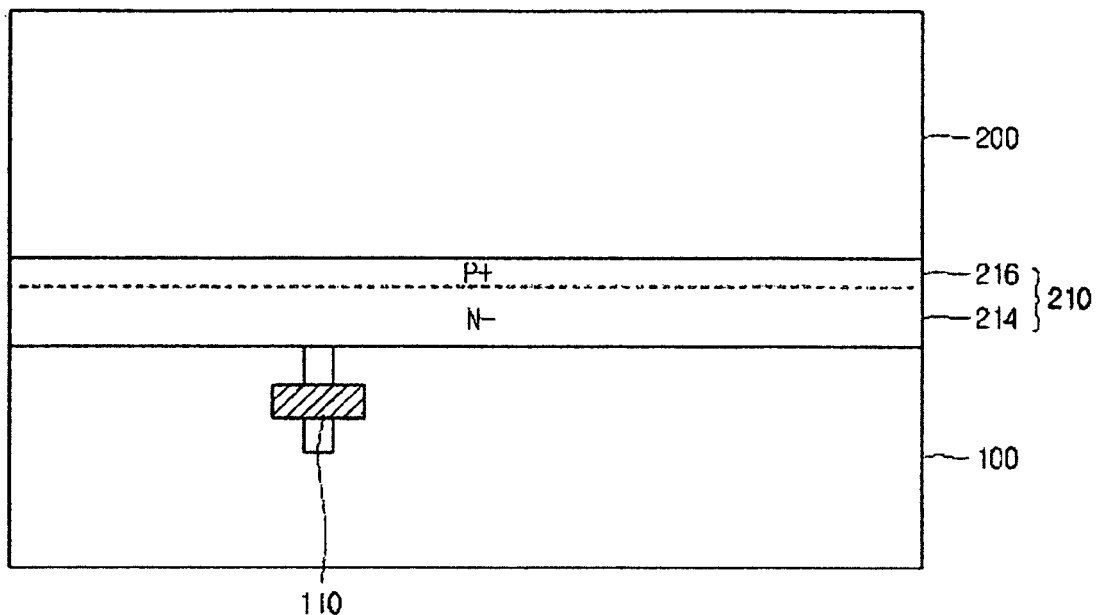

Next, as shown in FIG. 12, the second substrate 200 can be bonded to the first substrate 100 such that the photodiode 210 of the second substrate 200 contacts the lower metal line 110 of the first substrate 100.

For example, the first substrate 100 and the second substrate 200 can be bonded by contacting the first substrate 100 and the second substrate 200 and then performing a plasma activation. However, embodiments are not limited thereto.

Figure 13:
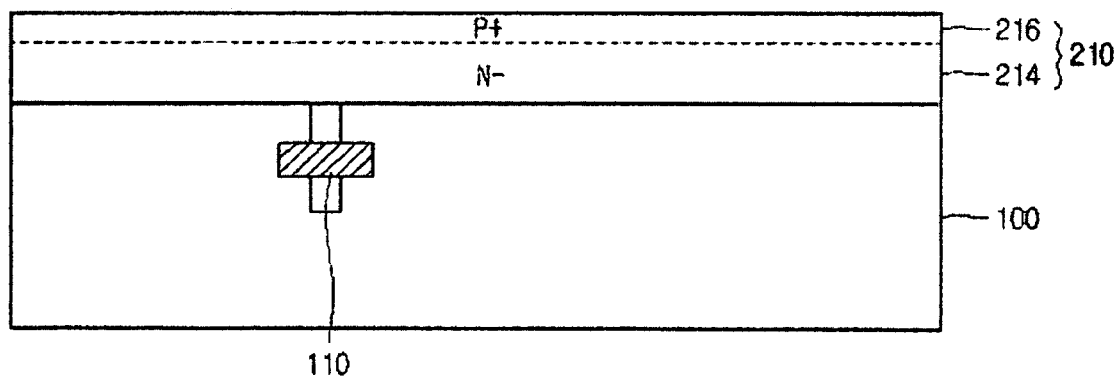

Next, as shown in FIG. 13, a portion of the bonded second substrate 200 is removed to expose and leave the photodiode 210 on the first substrate 100.

For example, in the case where the second substrate 200 includes an insulating layer interposed between the second substrate 200 and the crystalline semiconductor layer, the portion of the second substrate 200 can be removed by back grinding, and the insulating layer exposed after the removal of the portion of the second substrate 200 can be removed by an etch to leave only the photodiode 210 on the first substrate 100.

Alternatively, in the case where part of the second substrate 200 itself is used as a crystalline semiconductor layer in which a photodiode is formed, hydrogen ions (H+) can be implanted, before bonding the first substrate 100 to the second substrate 200, into the lower portion of the crystalline semiconductor layer in which a photodiode is formed, and the second substrate 200 can then be thermally annealed after being bonded to the first substrate 100 to transform the hydrogen ions (H+) into hydrogen gas ($H_2$), thereby leaving only the photodiode and removing the second substrate.

Figure 14:
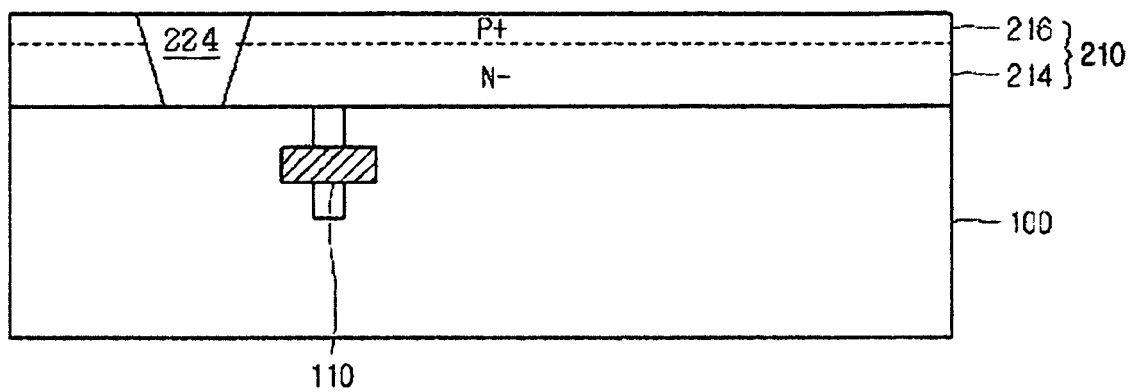

Next, as shown in FIG. 14, a pixel isolation layer 224 that can inhibit crosstalk between pixels can be formed in the photodiode 210 remaining on the first substrate 100 after removing the portion of the second substrate 200.

For example, the pixel isolation layer 224 can be formed by forming a trench in the photodiode 210 and filling the trench with an insulating layer.

Figure 15:
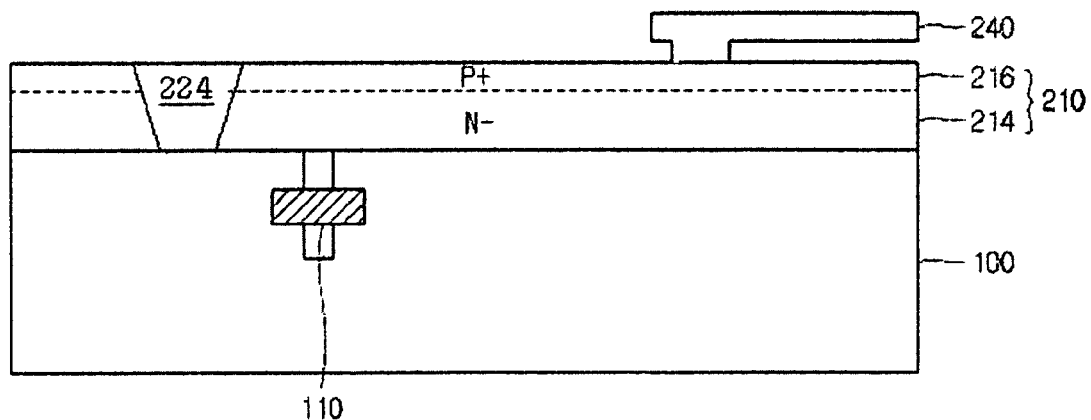

Next, as shown in FIG. 15, a top metal 240 can be formed on the photodiode 210, and then a passivation may be performed. Also, a color filter (not shown) can be further formed on the photodiode 210, and a microlens can be further formed on the color filter.

Also, in the present embodiment, a transparent conduction layer (not shown) can be formed between the photodiode 210 and the top metal 240 such that the top metal is not formed in each pixel and the transparent conduction layer performs the function of the top metal. In an embodiment, the transparent conduction layer can be formed of indium-tin-oxide (ITO), but embodiments are not limited thereto. In one embodiment, the transparent conduction layer can be formed to overlap at least two pixel regions.

Figure 17:
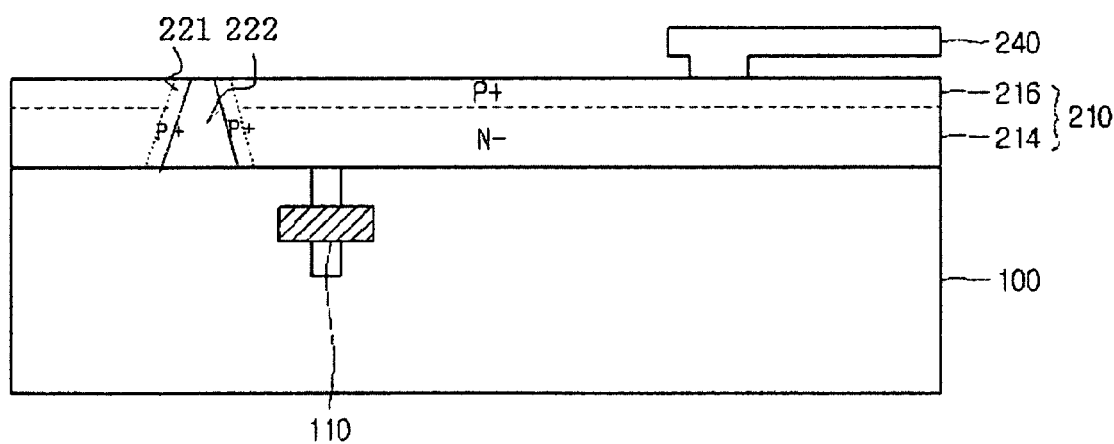
FIG. 17 is a cross-sectional view of an image sensor according to a third embodiment.

FIG. 17 is a cross-sectional view of an image sensor according to a third embodiment.

The image sensor according to the third embodiment can employ the technical characteristics of the image sensor and the method for manufacturing the same according to the first embodiment.

Unlike in the first embodiment, in the third embodiment, the image sensor can further include a second conductive type ion implantation layer 221 between the photodiode 210 and the pixel isolation layer 222.

For example, the image sensor according to the third embodiment can further inhibit crosstalk between pixels of electrons or holes generated in the photodiode 210 by interposing the second conductive type ion implantation layer 221 between the photodiode 210 and the pixel isolation layer 222.

Figure 18:
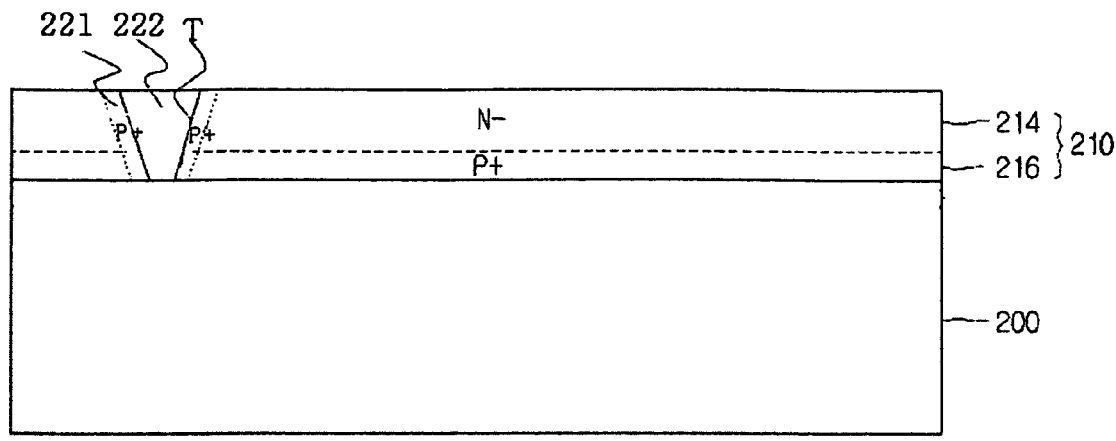
FIG. 18 is a cross-sectional view illustrating a method for manufacturing an image sensor according to the third embodiment.

For this purpose, as shown in FIG. 18, the photodiode 210 can be formed in a single crystal layer of the second substrate 200, a trench T for the pixel isolation layer can be formed, and then P-type ions can be heavily implanted to form a P+ ion implantation layer 221. Thereafter, the trench can be filled to form the pixel isolation layer 222.

Alternatively, after the pixel isolation layer 222 is formed, P-type ions can be heavily implanted into an interface between the photodiode 210 and the pixel isolation layer 222 to form a P+ ion implantation layer 221.

Figure 19:
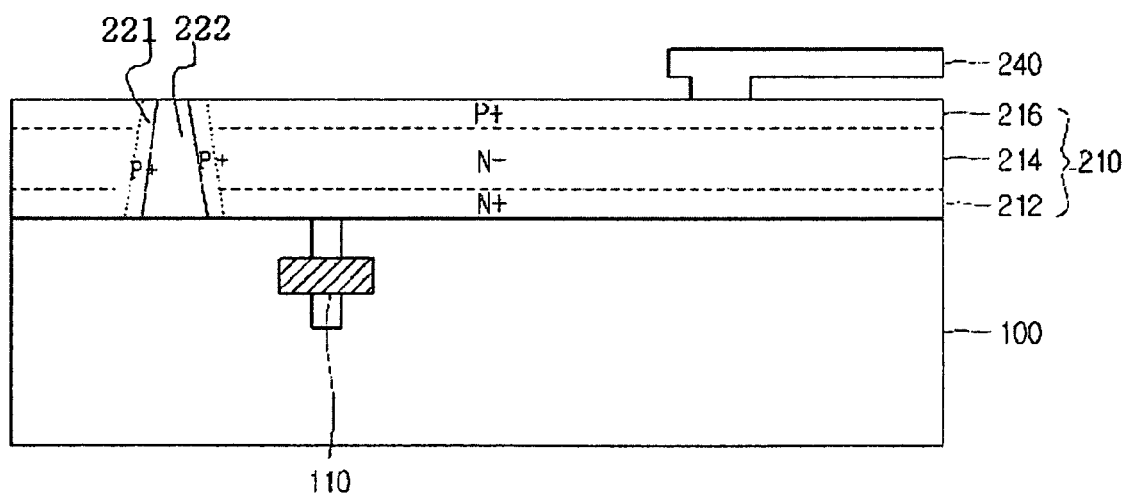
FIG. 19 is a cross-sectional view of an image sensor according to another embodiment of the third embodiment.

FIG. 19 is a cross-sectional view of an image sensor according to another embodiment of the third embodiment.

In this embodiment, a heavily doped first conductive type conduction layer 212 is further formed for an ohmic contact when the photodiode 210 is formed.

According to the third embodiment, a second conductive type ion implantation layer 221 can be formed together with the pixel isolation layer 222, thereby more effectively inhibiting crosstalk between pixels from electrons or holes generated in the photodiode 210.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
preparing a first substrate having a lower metal line and circuitry thereon;
preparing a second substrate having a photodiode thereon;
forming a pixel isolation layer in the photodiode of the second substrate, the pixel isolation layer separating the photodiode according to pixels;
bonding the first substrate to the second substrate such that the photodiode in which the pixel isolation layer is formed electrically contacts the lower metal line;
removing a portion of the bonded second substrate to leave the photodiode on the first substrate; and
forming a second conductive type ion implantation layer at lateral regions between the photodiode and the pixel isolation layer,
wherein the photodiode is formed vertically above the circuitry,
wherein forming the pixel isolation layer comprises:
forming a trench in the photodiode corresponding to a region between pixels; and
filling the trench with an insulating layer,
wherein forming the second conductive type ion implantation layer comprises:
implanting second conductive type ions into the photodiode at the region between pixels after tilling the trench with the insulating layer to provide the second conductive type ions at the lateral region between the trench and the photodiode.

2. The method of claim 1, wherein the preparing of the second substrate comprises:
forming a crystalline semiconductor layer on the second substrate; and forming a photodiode in the crystalline semiconductor layer.

3. The method of claim 2, wherein the forming of the photodiode in the crystalline semiconductor layer comprises:
   forming a second conductive type conduction layer in the crystalline semiconductor layer; and
   forming a first conductive type conduction layer in the crystalline semiconductor layer on the second conductive type conduction layer.

4. The method of claim 3, wherein the forming of the photodiode in the crystalline semiconductor layer further comprises:
   after the forming of the first conductive type conduction layer, forming a heavily doped first conductive type conduction layer in the crystalline semiconductor layer on the first conductive type conduction layer.

5. A method for manufacturing an image sensor, comprising:
   preparing a first substrate having a lower metal line and a circuitry thereon;
   preparing a second substrate having a photodiode thereon;
   bonding the first substrate to the second substrate such that the photodiode contacts the lower metal line;
   removing a portion of the bonded second substrate to expose the photodiode on the first substrate;
   forming a pixel isolation layer in portions of the exposed photodiode to separate the photodiode according to pixels; and
   forming a second conductive type ion implantation layer at lateral regions between the photodiode and the pixel isolation layer,
   wherein the photodiode is formed vertically above the circuitry,
   wherein forming the pixel isolation layer comprises:
      forming a trench in the photodiode corresponding to a region between pixels; and
      filling the trench with an insulating layer,
   wherein forming the second conductive type ion implantation layer comprises:
      implanting second type ions into the photodiode at the region between pixels after filling the trench with the insulating layer to provide the second conductive type ions at a lateral region between the trench and the photodiode.

6. The method of claim 5, wherein the preparing of the second substrate comprises:
   forming a crystalline semiconductor layer on the second substrate; and
   forming a photodiode in the crystalline semiconductor layer.

7. The method of claim 6, wherein the forming of the photodiode in the crystalline semiconductor layer comprises:
   forming a second conductive type conduction layer in the crystalline semiconductor layer; and
   forming a first conductive type conduction layer in the crystalline semiconductor layer on the second conductive type conduction layer.

8. The method of claim 7, wherein the forming of the photodiode in the crystalline semiconductor layer further comprises:
   after the forming of the first conductive type conduction layer, forming a heavily doped first conductive type conduction layer in the crystalline semiconductor layer on the first conductive type conduction layer.

* * * * *